(12) United States Patent
Yang

(10) Patent No.: US 6,924,195 B2
(45) Date of Patent: Aug. 2, 2005

(54) METHODS OF FORMING METAL-COMPRISING MATERIALS AND CAPACITOR ELECTRODES; AND CAPACITOR CONSTRUCTIONS

(75) Inventor: Haining Yang, Poughkeepsie, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/778,795

(22) Filed: Feb. 12, 2004

(65) Prior Publication Data

US 2004/0161892 A1 Aug. 19, 2004

Related U.S. Application Data

(62) Division of application No. 10/140,608, filed on May 7, 2002, which is a division of application No. 09/932,236, filed on Aug. 16, 2001.

(51) Int. Cl.$^7$ ............................................ H01L 21/8242
(52) U.S. Cl. ........................ 438/253; 438/396; 438/681; 438/686
(58) Field of Search ............................... 438/240, 253, 438/386, 393, 396, 650, 652, 656, 680, 681, 686, 763

(56) References Cited

U.S. PATENT DOCUMENTS

| | | | |
|---|---|---|---|
| 5,130,172 A | * | 7/1992 | Hicks et al. ................ 427/584 |
| 5,248,636 A | | 9/1993 | Davis |
| 5,372,849 A | | 12/1994 | McCormick et al. |
| 5,668,040 A | | 9/1997 | Byun |
| 5,817,175 A | * | 10/1998 | Iyer ............................ 117/104 |
| 5,856,236 A | | 1/1999 | Lai et al. |
| 5,907,789 A | | 5/1999 | Komatsu |
| 6,063,705 A | | 5/2000 | Vaartstra |
| 6,074,945 A | | 6/2000 | Vaartstra et al. |
| 6,143,191 A | | 11/2000 | Baum et al. |
| 6,162,712 A | * | 12/2000 | Baum et al. ................ 438/580 |
| 6,197,628 B1 | | 3/2001 | Vaartstra et al. |
| 6,211,034 B1 | | 4/2001 | Visokay et al. |
| 6,271,131 B1 | | 8/2001 | Uhlenbrock et al. |
| 6,294,425 B1 | | 9/2001 | Hideki |
| 6,355,492 B1 | | 3/2002 | Tanaka et al. |
| 6,358,790 B1 | | 3/2002 | Fritzinger et al. |
| 6,391,797 B1 | | 5/2002 | Takehiro et al. |
| 6,515,843 B2 | * | 2/2003 | Nakabayashi et al. ...... 361/305 |
| 2003/0052356 A1 | | 3/2003 | Yang et al. |

FOREIGN PATENT DOCUMENTS

| | | |
|---|---|---|
| JP | 2001-160617 | 6/2001 |
| WO | WO 01/24237 A1 | 4/2001 |

OTHER PUBLICATIONS

Hiratani, M. et al., A Conformal Ruthenium Electrode for MIM Capacitors in Gbit DRAMs Using the CVD Technology Based on Oxygen–Controlled Surface Reaction, IEEE, 2000 Symposium on VLSI Technology Digest of Technical Papers, pp. 102–103.

Kim, Y. et al., "Growth RuOx Thin Films by Metal Organic Chemical Vapor Deposition", IEEE 1999, pp. 501–502.

Quirk, et al., *Semiconductor Manufacturing Technology* (2001), Prentice Hall, pp. 307–308.

Van Zant, Peter: Microchip Fabrication (2000); McGraw–Hill: Fourth Edition: pp. 504–506.

* cited by examiner

*Primary Examiner*—Stephen W. Smoot
(74) *Attorney, Agent, or Firm*—Wells St. John P.S.

(57) ABSTRACT

The invention includes a method of forming a metal-comprising mass for a semiconductor construction. A semiconductor substrate is provided, and a metallo-organic precursor is provided proximate the substrate. The precursor is exposed to a reducing atmosphere to release metal from the precursor, and subsequently the released metal is deposited over the semiconductor substrate. The invention also includes capacitor constructions, and methods of forming capacitor constructions.

11 Claims, 1 Drawing Sheet

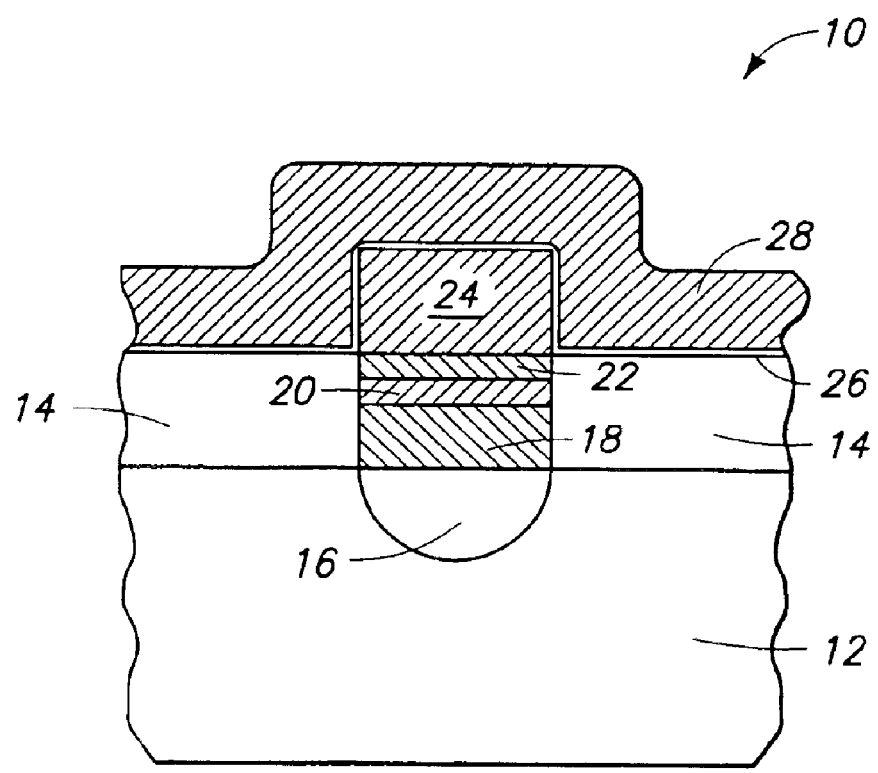

METHODS OF FORMING METAL-COMPRISING MATERIALS AND CAPACITOR ELECTRODES; AND CAPACITOR CONSTRUCTIONS

RELATED PATENT DATA

This patent resulted from a divisional application of U.S. patent application Ser. No. 10/140,608, which was filed May 7, 2002; which resulted from a divisional application of U.S. patent application Ser. No. 09/932,236, filed Aug. 16, 2001.

TECHNICAL FIELD

The invention pertains to methods of forming metal-comprising materials, such as, for example, capacitor electrodes. The invention also pertains to capacitor constructions.

BACKGROUND OF THE INVENTION

Capacitor constructions are utilized in numerous semiconductor structures, such as, for example, memory arrays. An exemplary memory array is a dynamic random access memory (DRAM) array, with individual DRAM cells of the array comprising a capacitor and a transistor.

Capacitor constructions comprise a first conductive capacitor electrode and a second conductive capacitor electrode, separated by a dielectric material. Among the compositions suitable for utilization as capacitor electrodes are metals, such as, for example, platinum, rhodium, iridium, ruthenium, etc. The metals can be deposited by exposing a metallo-organic precursor material to an oxidizing ambient (such as, for example, an ambient $O_2$, $O_3$, and/or $N_2O$) to break down the precursor and release the metal. The released metal can then deposit on a substrate to form a metal film which is ultimately incorporated into a capacitor device as a capacitor electrode.

A difficulty which can occur during oxidation of the metallo-organic precursors is that materials associated with a semiconductor substrate are exposed to the oxidizing conditions, and can themselves become oxidized or otherwise degraded during the degradation of the metallo-organic precursors. Accordingly, it would be desirable to develop alternative methods for formation of metallic materials on semiconductor substrates, other than the oxidation of metallo-organic precursors.

SUMMARY OF THE INVENTION

In one aspect, the invention encompasses a method of forming a metal-comprising mass for a semiconductor construction. A semiconductor substrate is provided, and a metallo-organic precursor is provided proximate the substrate. The precursor is exposed to a reducing atmosphere to release metal from the precursor, and subsequently the released metal is deposited over the semiconductor substrate.

In another aspect, the invention encompasses an embodiment of forming a metal-comprising mass for a semiconductor construction wherein a metal-comprising precursor is exposed to ammonia to release metal from the precursor, and subsequently the release metal is deposited over a semiconductor substrate.

In another aspect, the invention encompasses methodology for forming capacitor electrodes wherein a metal-comprising precursor is exposed to a reducing ambient to deposit a metal-comprising mass which ultimately is incorporated into a capacitor construction as a capacitor electrode.

The invention also includes capacitor constructions.

BRIEF DESCRIPTION OF THE DRAWINGS

Preferred embodiments of the invention are described below with reference to the following accompanying drawing.

The FIGURE is a diagrammatic, cross-sectional view of a semiconductor wafer fragment illustrating an embodiment of the present invention.

DETAILED DESCRIPTION OF THE PREFERRED EMBODIMENTS

An embodiment of the invention is described with reference to a semiconductor wafer fragment 10 in the figure. Fragment 10 includes a substrate 12, which can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative material 14 is formed over substrate 12, and can comprise, for example, borophosphosilicate glass (BPSG) and/or silicon dioxide. An opening extends through insulative material 14 and to substrate 12, and a diffusion region 16 is formed within substrate 12 at a base of such opening. Diffusion region 16 can be either n-type conductivity doped or p-type conductivity doped. Diffusion region 16 can be considered as an exemplary embodiment of an electrical node supported by substrate 12.

A series of conductive materials are formed within the opening in mass 14, and extending above diffusion region 16. Such conductive materials include a mass 18 of conductively-doped silicon, such as, for example, n-type or p-type doped polycrystalline silicon. The conductive materials also include a layer 20 of metal silicide, and a layer 22 comprising metal or metal nitride. It is noted that other conductive materials can be used either alternatively, or in addition to the materials 18, 20 and 22 illustrated in the figure. For instance, material 18 can be replaced by a conductive metal plug, such as, for example, a titanium plug or a tungsten plug. In other embodiments, a layer of metal-silicide can be provided between diffusion region 16 and silicon-containing layer 18, with exemplary metal silicides comprising titanium silicide or tungsten silicide. Layers 18, 20 and 22 can be formed by conventional methods.

In particular embodiments, layer 22 can comprise, consist of, or consist essentially of, one or more of titanium nitride, tungsten nitride, tantalum nitride, elemental titanium, elemental tantalum or elemental tungsten; and layer 20 can comprise, consist of, or consist essentially of, titanium silicide or tungsten silicide. Layers 20 and 22 function as diffusion and/or oxidation barriers.

A metal-containing mass 24 is formed over conductive layer 22, and in the shown embodiment is in physical contact with layer 22. In accordance with methodology of the present invention, mass 24 is formed by exposing a metallo-organic precursor to a reducing atmosphere to release metal from the precursor, and subsequently the released metal is deposited to form mass 24. In the shown embodiment, mass 24 is patterned into a rectangular block. Such can be accomplished by, for example, photolithographic processing and an appropriate etch after deposition of the released metal. Appropriate photolithographic processing and etching conditions will be recognized by persons of ordinary skill in the art.

Mass 24 can comprise, consist essentially of, or consist of one or more of ruthenium, rhodium, iridium, cobalt, palladium, nickel or platinum. In a particular embodiment, mass 24 will consist of, or consist essentially of, ruthenium, and will be formed by exposing tricarbonyl-cyclohexadiene ruthenium precursor to a reducing ambient comprising one or more of ammonia ($NH_3$), diatomic hydrogen ($H_2$), or plasma-activated hydrogen species. The reducing atmosphere can, in particular embodiments, consist of, or consist essentially of, one or more of ammonia, diatomic hydrogen or plasma-activated hydrogen species. In an exemplary embodiment, tricarbonyl-cyclohexadiene ruthenium precursor is exposed to ammonia at a temperature of 210° C., and a pressure of 4 torr for a duration of 120 seconds, to deposit mass 24 to a thickness of about 450 Å.

Prior art methodologies have existed wherein a metal-containing mass is formed over a layer identical to the above-described layer 22 by exposing a metallo-organic material to oxidizing conditions. However, a problem with such prior art processes is that the oxidizing conditions can oxidize various components of layer 22 to reduce the conductivity of such layer. For instance, if layer 22 comprises titanium, tantalum or tungsten, the exposure of such layer to oxidizing conditions can form oxides of titanium, tungsten or tantalum. Such oxides are electrically insulative, and accordingly the desired conductive characteristics of layer 22 are compromised, or in some cases even entirely lost, which can render devices subsequently formed from layer 22 to be inoperable. In contrast, the utilization of reducing conditions in embodiments of the present invention can avoid oxidation of the materials of layer 22, and accordingly maintain the desired conductive characteristics of layer 22 during formation of mass 24. A further advantage of utilizing reducing conditions in methodology of the present invention is that many metallo-organic precursor materials contain oxygen, which can be released during chemical degradation of the precursor materials. The released oxygen can oxidize substrate materials. However, utilization of a reducing atmosphere can essentially scavenge the oxygen before it deleteriously reacts with a substrate material. For instance, in particular embodiments of the present invention, $NH_3$ can be utilized to essentially scavenge oxygen.

A reason that reducing conditions have not previously been utilized for forming conductive masses in semiconductor constructions is that there is a concern that carbon from a metallo-organic precursor will deposit within a conductive metal mass formed from the precursor unless the precursor is exposed to oxidizing conditions. In one aspect of the present invention, it is recognized that carbon incorporation is less problematic in particular semiconductor fabrication applications than is oxidation of materials associated with a semiconductor device. For instance, in the embodiment described with reference to the FIGURE, it can be highly desirable to maintain the conductive characteristics of layer 22, and of less concern is elimination of carbon from mass 24. Accordingly, utilization of reducing conditions to form mass 24 is preferred relative to utilization of oxidizing conditions, even if such causes an increase in carbon incorporation within mass 24 relative to that which would occur with utilization of oxidizing conditions. However, an analysis of a mass 24 formed by exposing tricarbonyl-cyclohexadiene ruthenium precursor to ammonia has shown that there is very little carbon incorporation within such mass. Accordingly, in particular embodiments of the present invention, oxidation of layer 22 can be avoided, and also carbon incorporation within mass 24 can be avoided. Such can be preferred embodiments of the present invention, but it is to be understood that the invention can also encompass embodiments wherein carbon incorporation occurs within mass 24.

Mass 24 can, in particular embodiments, comprises multiple metals formed from one or more precursors. The multiple metals can include one or more of ruthenium, rhodium, iridium, cobalt, palladium, nickel or platinum. In some aspects of the invention, it can be desired that mass 24 does not consist solely of platinum. However, in such aspects, mass 24 can comprise platinum in combination with other metals. Accordingly, it can be desired that mass 24 be formed from at least one precursor that comprises a metal other than platinum; but such at least one precursor can be utilized in combination with other precursors that do comprise platinum.

After formation of mass 24, a dielectric material 26 is provided over the mass. Dielectric material 26 can comprise silicon dioxide and/or silicon nitride. Additionally, or alternatively, dielectric material 26 can comprise a so-called high-k material, such as, for example, $Ta_2O_5$.

After formation of dielectric material 26, a second capacitor electrode 28 is formed over dielectric material 26. Capacitor electrode 28 can comprise metal and/or conductively-doped silicon. If electrode 28 comprises metal, such can be formed utilizing a reducing atmosphere as was described previously for formation of mass 24. Alternatively, electrode 28 can be formed by exposing a metallo-organic precursor to an oxidizing atmosphere. In preferred embodiments of the invention, dielectric material 26 can comprise a high-k material, and electrode 28 is formed by exposing a metallo-organic precursor to oxidizing conditions. The oxidizing conditions can cure oxide deficiencies that can otherwise exist in a high-k material. For instance, if the high-k material comprises $Ta_2O_5$, there can be regions in the material which have an excess of tantalum relative to the amount of oxygen so that the material is tantalum-rich (i.e., so that there is more tantalum than should be present in the stoichiometric relationship $Ta_2O_5$). Such tantalum-rich regions will lack the desired dielectric characteristics of the high-k material. Exposure of the tantalum-rich regions to oxidizing conditions can convert such regions to $Ta_2O_5$, and accordingly improve the dielectric properties associated with the regions.

Second capacitor electrode 28 can comprise, consist of, or consist essentially of ruthenium, rhodium, iridium, cobalt, palladium, nickel or platinum; and can comprise an identical metal to that utilized in mass 24, or a different metal than that utilized in mass 24. In particular preferred embodiments, mass 24 will be formed by exposing a metallo-organic precursor to a reducing environment, and will constitute a first capacitor electrode; and mass 28 will be formed by exposing the same metallo-organic precursor, or a different metallo-organic precursor, to an oxidizing atmosphere, and will constitute a second capacitor electrode.

The masses 24, 26 and 28 of the FIGURE together define at least a portion of a capacitor construction. Such capacitor construction can be incorporated into various semiconductor devices, such as, for example, a DRAM cell. In embodiments in which the capacitor construction is incorporated into a DRAM cell, there will typically be a transistor gate (not shown) utilizing diffusion region 16 as a source/drain region, and accordingly electrically connected to mass 24 though diffusion region 16. In such embodiments, mass 24 can be considered a storage node of a capacitor construction.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor, comprising:
   providing a semiconductor substrate having an electrical node supported thereby;
   forming an electrical interconnect in electrical contact with the node, the electrical interconnect comprising conductively-doped silicon;
   forming a conductive material over the electrical interconnect, the conductive material comprising one or more of titanium, tantalum and tungsten;
   providing a metallo-organic precursor proximate the conductive material, the metallo-organic precursor comprising one or more of ruthenium, rhodium, iridium, cobalt, palladium, platinum and nickel;
   exposing the precursor to a reducing atmosphere to release metal from the precursor, the released metal consisting essentially of one or more of ruthenium, rhodium, iridium, cobalt, palladium, platinum arid nickel;
   depositing the released metal over the conductive material to form a first capacitor electrode;
   forming a dielectric material over the first capacitor electrode;
   forming a second capacitor electrode over the dielectric material; wherein the second capacitor electrode comprises metal; and wherein the forming the second capacitor electrode comprises exposing a metal-comprising precursor to an oxidizing atmosphere; and wherein the oxidizing atmosphere improves dielectric properties of the dielectric material.

2. The method of claim 1 wherein the metallo-organic precursor comprises ruthenium, and wherein the released metal consists essentially of ruthenium.

3. The method of claim 1 wherein the metallo-organic precursor comprises rhodium, and wherein the released metal consists essentially of rhodium.

4. The method of claim 1 wherein the metallo-organic precursor comprises iridium, and wherein the released metal consists essentially of iridium.

5. The method of claim 1 wherein the metallo-organic precursor comprises cobalt, and wherein the released metal consists essentially of cobalt.

6. The method of claim 1 wherein the metallo-organic precursor comprises palladium, and wherein the released metal consists essentially of palladium.

7. The method of claim 1 wherein the metallo-organic precursor comprises platinum, and wherein the released metal consists essentially of platinum.

8. The method of claim 1 wherein the metallo-organic precursor comprises nickel, and wherein the released metal consists essentially of nickel.

9. The method of claim 1 wherein the reducing atmosphere comprises $H_2$.

10. The method of claim 1 wherein the reducing atmosphere comprises plasma-activated hydrogen.

11. The method of claim 1 wherein the reducing atmosphere comprises $NH_3$.

* * * * *

UNITED STATES PATENT AND TRADEMARK OFFICE
CERTIFICATE OF CORRECTION

| | |
|---|---|
| PATENT NO. | : 6,924,195 B2 |
| APPLICATION NO. | : 10/778795 |
| DATED | : February 12, 2004 |
| INVENTOR(S) | : Haining Yang |

It is certified that error appears in the above-identified patent and that said Letters Patent is hereby corrected as shown below:

Col. 5, line 4 -
 Replace "though diffusion region 16. In such embodiments, mass 24"
 With -- through diffusion region 16. In such embodiments, mass 24 --

Col. 5, line 34, claim 1 -
 Replace "rhodium, iridium, cobalt, palladium, platinum arid"
 With --rhodium, iridium, cobalt, palladium, platinum and--

Signed and Sealed this

First Day of August, 2006

JON W. DUDAS
*Director of the United States Patent and Trademark Office*

UNITED STATES PATENT AND TRADEMARK OFFICE
CERTIFICATE OF CORRECTION

PATENT NO.         : 6,924,195 B2                                              Page 1 of 1
APPLICATION NO. : 10/778795
DATED              : August 2, 2005
INVENTOR(S)       : Haining Yang It is certified that error appears in the above-identified patent and that said Letters Patent is hereby corrected as shown below:

Col. 5, line 4 -
 Replace "though diffusion region 16. In such embodiments, mass 24"
 With --through diffusion region 16. In such embodiments, mass 24--

Col. 5, line 34, claim 1 -
 Replace "rhodium, iridium, cobalt, palladium, platinum arid"
 With --rhodium, iridium, cobalt, palladium, platinum and--

This certificate supersedes Certificate of Correction issued August 1, 2006.

Signed and Sealed this

Nineteenth Day of September, 2006

JON W. DUDAS
*Director of the United States Patent and Trademark Office*